(12) United States Patent
Tominaga

(10) Patent No.: US 9,497,543 B2
(45) Date of Patent: Nov. 15, 2016

(54) SOUND SIGNAL PROCESSING APPARATUS

(75) Inventor: Satoshi Tominaga, Hamamatsu (JP)

(73) Assignee: YAMAHA CORPORATION, Hamamatsu-shi (JP)

( * ) Notice: Subject to any disclaimer, the term of this patent is extended or adjusted under 35 U.S.C. 154(b) by 455 days.

(21) Appl. No.: 13/392,562

(22) PCT Filed: Aug. 27, 2010

(86) PCT No.: PCT/JP2010/064650
§ 371 (c)(1),
(2), (4) Date: Feb. 27, 2012

(87) PCT Pub. No.: WO2011/024978
PCT Pub. Date: Mar. 3, 2011

(65) Prior Publication Data
US 2012/0155677 A1    Jun. 21, 2012

(30) Foreign Application Priority Data

Aug. 27, 2009 (JP) ................. 2009-196751

(51) Int. Cl.
H02B 1/00 (2006.01)
H04R 3/00 (2006.01)
(Continued)

(52) U.S. Cl.
CPC .............. *H04R 3/005* (2013.01); *H03G 3/348* (2013.01); *H03G 5/00* (2013.01); *H04B 15/00* (2013.01);
(Continued)

(58) Field of Classification Search
CPC ..................... H03G 3/348; H03G 5/00; H04N 21/4396; H04N 7/15; H04R 3/005;
(Continued)

(56) References Cited

U.S. PATENT DOCUMENTS 5,631,669 A * 5/1997 Stobbs ................ G06F 3/03543
345/156
5,855,004 A * 12/1998 Novosel et al. .............. 704/272
(Continued)

FOREIGN PATENT DOCUMENTS

CN         1868199 A      11/2006
CN       101384028 A       3/2009
(Continued)

OTHER PUBLICATIONS

Extended European Search Report for corresponding EP 10812027.0, mail date Feb. 13, 2013. English translation provided.
(Continued)

*Primary Examiner* — Davetta W Goins
*Assistant Examiner* — Kuassi Ganmavo
(74) *Attorney, Agent, or Firm* — Rossi, Kimms & McDowell LLP

(57) ABSTRACT

A sound signal processing apparatus includes: a sound collector configured to collect a sound from an environment and configured to generate a sound collection signal; a signal controller configured to generate a sound signal based on the sound collection signal; a housing; a detector configured to detect a posture of the housing; and a selector configured to output one of the sound signal and a soundless signal based on the detected posture.

11 Claims, 6 Drawing Sheets

(51) Int. Cl.
*H04B 15/00* (2006.01)
*H04N 21/439* (2011.01)
*H03G 5/00* (2006.01)
*H04N 7/15* (2006.01)
*H03G 3/34* (2006.01)
*H04R 25/00* (2006.01)

(52) U.S. Cl.
CPC ............ *H04N 7/15* (2013.01); *H04N 21/4396* (2013.01); *H04R 25/405* (2013.01); *H04R 2201/109* (2013.01)

(58) Field of Classification Search
CPC .............. H04R 2410/00; H04R 25/407; H04R 25/405; H04B 15/00; H04M 1/60
USPC ............ 381/309, 123, 74, 77–80, 94.1–94.7, 381/71.1–71.5, 86, 389, 81; 455/425, 455/456.1, 456.2, 456.5, 456.6, 456.3; 379/433.02, 188, 52
See application file for complete search history.

(56) References Cited

U.S. PATENT DOCUMENTS

| | | | | |
|---|---|---|---|---|
| 6,549,792 | B1* | 4/2003 | Cannon et al. | 455/550.1 |
| 7,142,666 | B1* | 11/2006 | Bates | H04M 1/19 |
| | | | | 379/421 |
| 8,265,782 | B2* | 9/2012 | Hwang et al. | 700/94 |
| 8,868,100 | B1* | 10/2014 | Price | H04M 1/6008 |
| | | | | 379/388.02 |
| 2007/0008284 | A1* | 1/2007 | Kim | G06F 3/162 |
| | | | | 345/163 |
| 2007/0019825 | A1* | 1/2007 | Marumoto et al. | 381/94.1 |
| 2007/0060215 | A1* | 3/2007 | Asakura | 455/575.3 |
| 2007/0259685 | A1* | 11/2007 | Engblom | G06F 1/1626 |
| | | | | 455/550.1 |
| 2009/0099812 | A1* | 4/2009 | Kahn | H04M 1/72522 |
| | | | | 702/152 |
| 2011/0040962 | A1* | 2/2011 | Peyre | 713/100 |
| 2011/0305351 | A1* | 12/2011 | Kimura | 381/94.1 |

FOREIGN PATENT DOCUMENTS

| | | | | |
|---|---|---|---|---|
| EP | 0867860 | A2 * | 9/1998 | ............ G10L 15/20 |
| EP | 1675357 | A1 | 10/2004 | |
| EP | 1748631 | A1 * | 1/2007 | ............ H04M 1/605 |
| JP | 2005-123916 | A | 5/2005 | |
| JP | 4125815 | B2 | 5/2008 | |
| JP | 2008158723 | A | 7/2008 | |
| JP | 2009-077200 | A | 4/2009 | |
| JP | 2009177557 | A | 8/2009 | |
| JP | 2010-056878 | A | 3/2010 | |
| WO | 2009144398 | A1 | 12/2009 | |

OTHER PUBLICATIONS

Notification of Reasons for Refusal for corresponding JP 2009-196751, dated Aug. 26, 2013. English translation provided.
International Search Report issued Nov. 2, 2010 for PCT/JP2010/064650.
Chinese Office Action dated Feb. 8, 2014 issued in counterpart appl No. 201080037895.6. English translation provided.

* cited by examiner

SOUND SIGNAL PROCESSING APPARATUS

This application is a U. S. National Phase Application of PCT International Application PCT/JP2010/064650 filed on Aug. 27, 2010 which is based on and claims priority from JP 2009-196751 filed on Aug. 27, 2009 the contents of which is incorporated herein in its entirety by reference.

TECHNICAL FIELD

The present invention relates to a sound signal processing apparatus that switches from one processing of a sound signal to another processing according to a posture of a subject device.

BACKGROUND ART

There have been proposed a variety of devices that conduct various sound signal processing such as sound collection or sound emission. Among those devices, there is a sound communication device having a sound emission and collection function that collects sounds on a subject device side, and transmits the collected sounds to a-partner device, and emits a sound signal from the partner device.

As an example of the above sound communication devices, there is a stationary phone having a main body and a receiver. Also, the main body includes a sound collection microphone and a sound emission speaker, and enables a call in a handsfree manner.

However, in those devices, when the main body or the receiver travels or collides with another object during a call (sound communication), a noise occurring due to the travel or collision may be collected, and transmitted to the partner device.

As one of solutions to the above problems, Patent Literature 1 discloses a technique in which in the stationary phone having the main body and the receiver, an impact occurring when the receiver is returned to the main body is detected by the main body, and mute processing is conducted so as not to transmit an impact sound.

PRIOR ART

Patent Literature

Patent Literature 1: Japanese Patent No. 4125815

SUMMARY OF THE INVENTION

Problems that the Invention is to Solve

However, in the technique of Patent Literature 1, the impact when the receiver is returned to the main body is detected by the main body different from the receiver having the microphone, two members including the receiver and the main body are provided, and the mute processing cannot be surely realized unless those members collide with each other with a given strength. For that reason, this technique cannot be applied to an integral sound communication device in which an operating portion and the sound collection microphone are intensively arranged in a single main body.

Incidentally, one type of the above integral sound communication devices changes an operating mode according to a posture of the main body. In this sound communication device, the main body must intentionally travel, and the main body has an impact depending on how to travel. Also, when the sound communication device is small in size, the main body may travel or fall due to an incidental contact from the external. For that reason, the sound communication device of this type must detect a change in the posture and a travel thereof by itself, and conduct the mute processing.

Accordingly, an object of the present invention is to realize a sound communication device which can detect a change in posture or a travel thereof by itself to execute mute processing on a sound collection signal as the occasion demands.

Means for Solving the Problems

According to the invention, there is provided a sound signal processing apparatus comprising: a sound collector configured to collect a sound from an environment and configured to generate a sound collection signal; a signal controller configured to generate a sound signal based on the sound collection signal; a housing; a detector configured to detect a posture of the housing; and a selector configured to output one of the sound signal and a soundless signal based on the detected posture.

The detector may include an acceleration sensor configured to measure accelerations in three directions orthogonal to each other.

The selector may output the sound signal if a difference between an output level of the acceleration sensor in a vertical direction when the housing is in a basic posture and an output level of the acceleration sensor in a direction corresponding to the vertical direction in the basic posture when the housing is not in the basic posture is lower than a given level, and the selector may output the soundless signal if the difference is the given level or higher.

The selector may output the sound signal if a time change rate of an output level of the acceleration sensor is lower than a given level, and the selector may output the soundless signal if the time change rate is the given level or higher.

The selector may execute determination for selecting an output of the sound signal at a given timing interval, and the selector may output the sound signal if determination for selecting no output of the soundless signal is continued for a given period after selecting an output of the soundless signal.

The detector may detect a motion of the housing.

When the housing is in a first posture, the detector outputs a first output level in a first direction. When the housing is in a second posture which is not the first posture, the detector outputs a second output level in a second direction, and the second direction corresponds to the first direction when the housing is in the first posture. The selector may output the sound signal if a difference between the first output level and the second output level is lower than a given level, and the selector may output the soundless signal if the difference is the given level or higher.

The selector may output the sound signal if a time change rate of an output level of the detector is lower than a given level, and the selector may output the soundless signal if the time change rate is the given level or higher.

MODE FOR CARRYING OUT THE INVENTION

A sound emission and collection device according to an embodiment of the present invention will be described with reference to the drawings. In this embodiment, a sound emission and collection device 1 that emits and collects sound will be exemplified as a sound signal processing apparatus.

Figure 1:
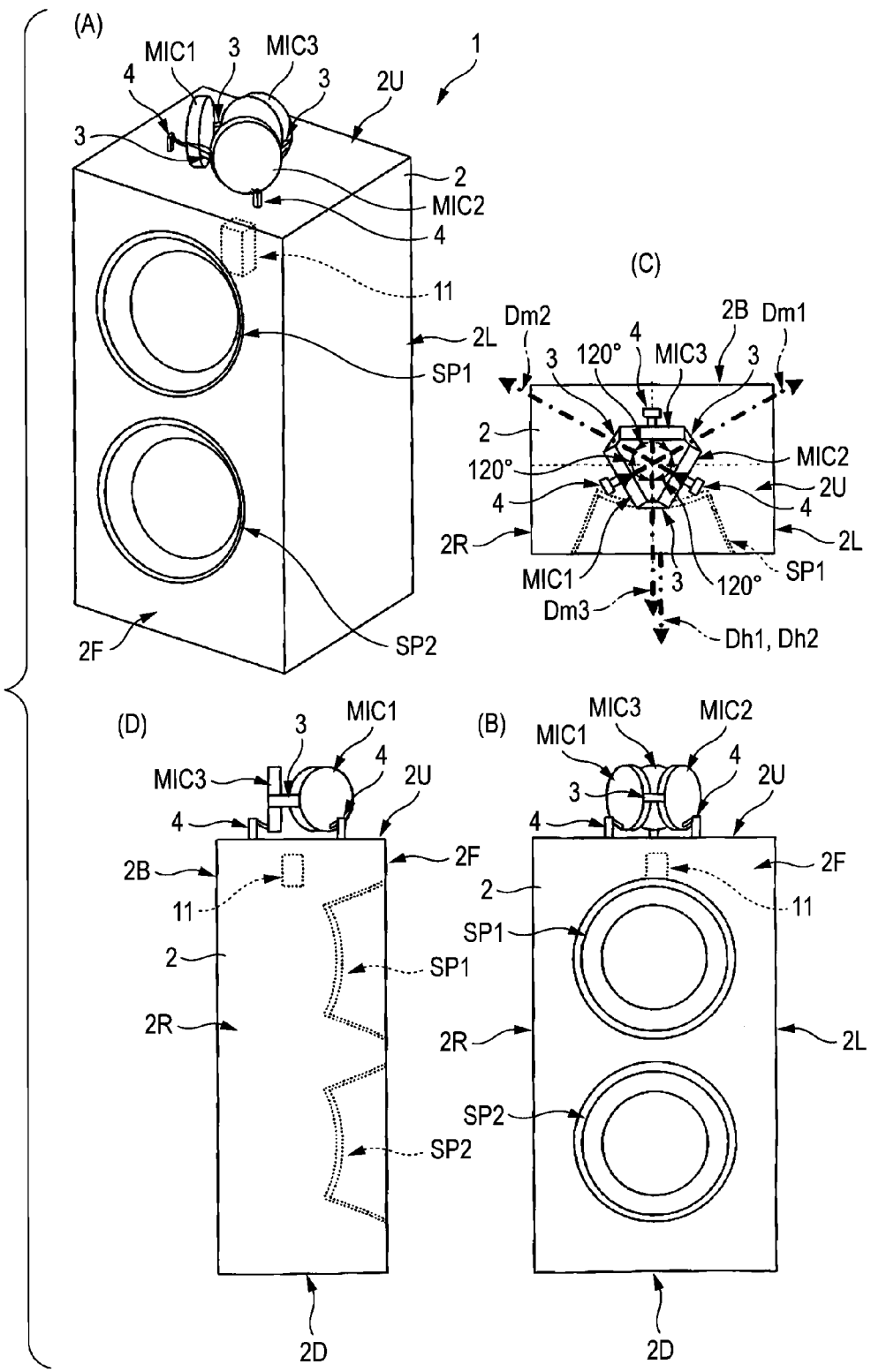
FIG. 1(A), FIG. 1(B), FIG. 1(C), and FIG. 1(D) are diagrams illustrating an exterior of a sound emission and collection device according to an embodiment of the present invention.
Figure 2:
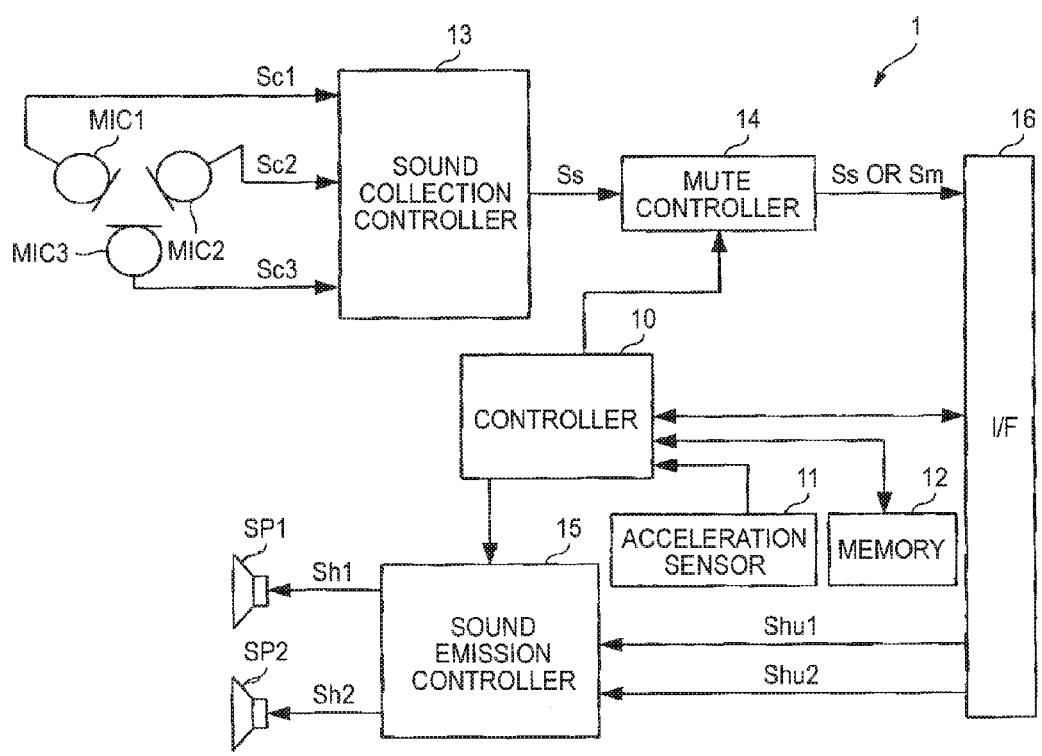
FIG. 2 is a circuit block diagram illustrating the sound emission and collection device according to the embodiment of the present invention.
Figure 3:
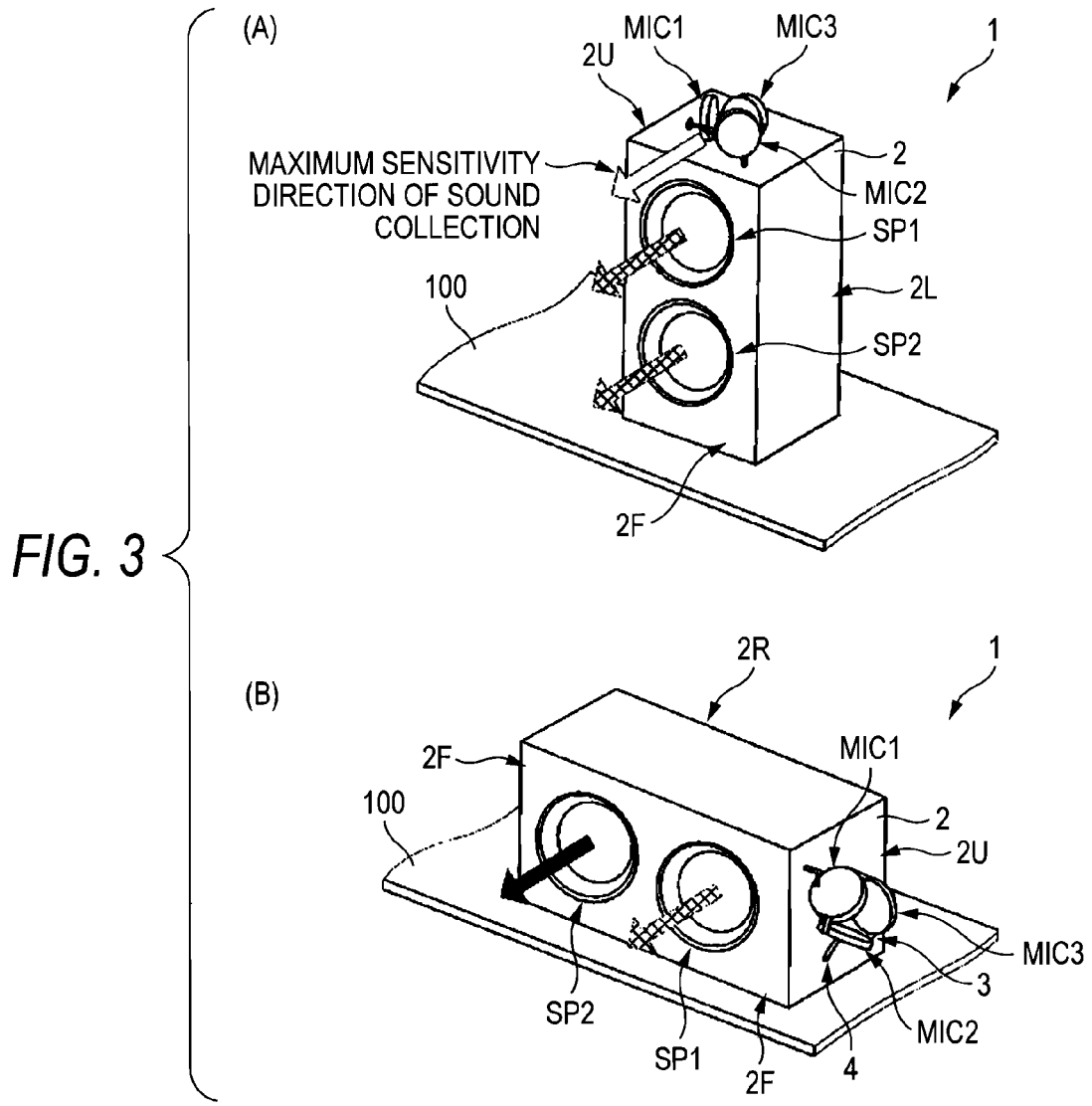
FIG. 3(A) and FIG. 3(B) are diagrams illustrating a use of the sound emission and collection device according to the embodiment of the present invention.
Figure 4:
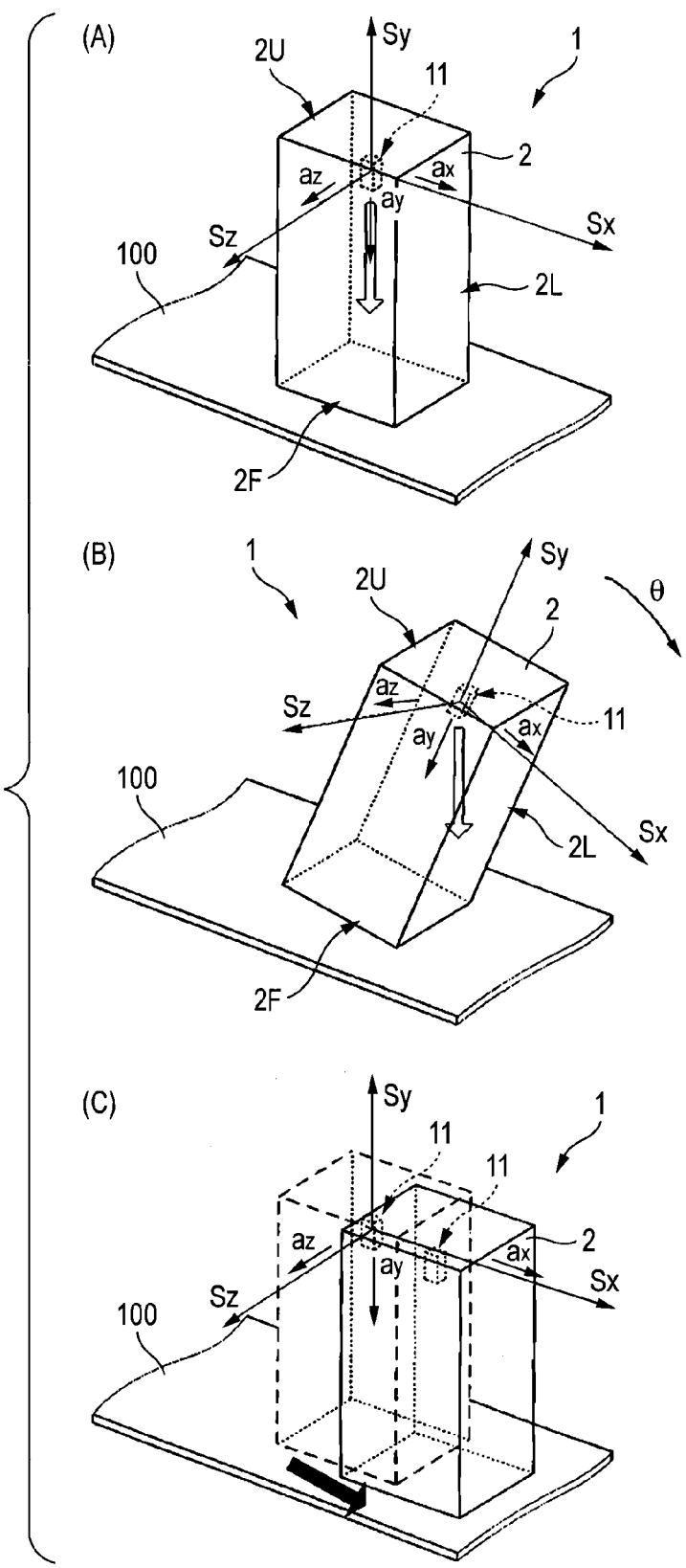
FIG. 4(A), FIG. 4(B), and FIG. 4(C) are diagrams illustrating a posture detection concept of the sound emission and collection device according to the embodiment of the present invention.
Figure 5:
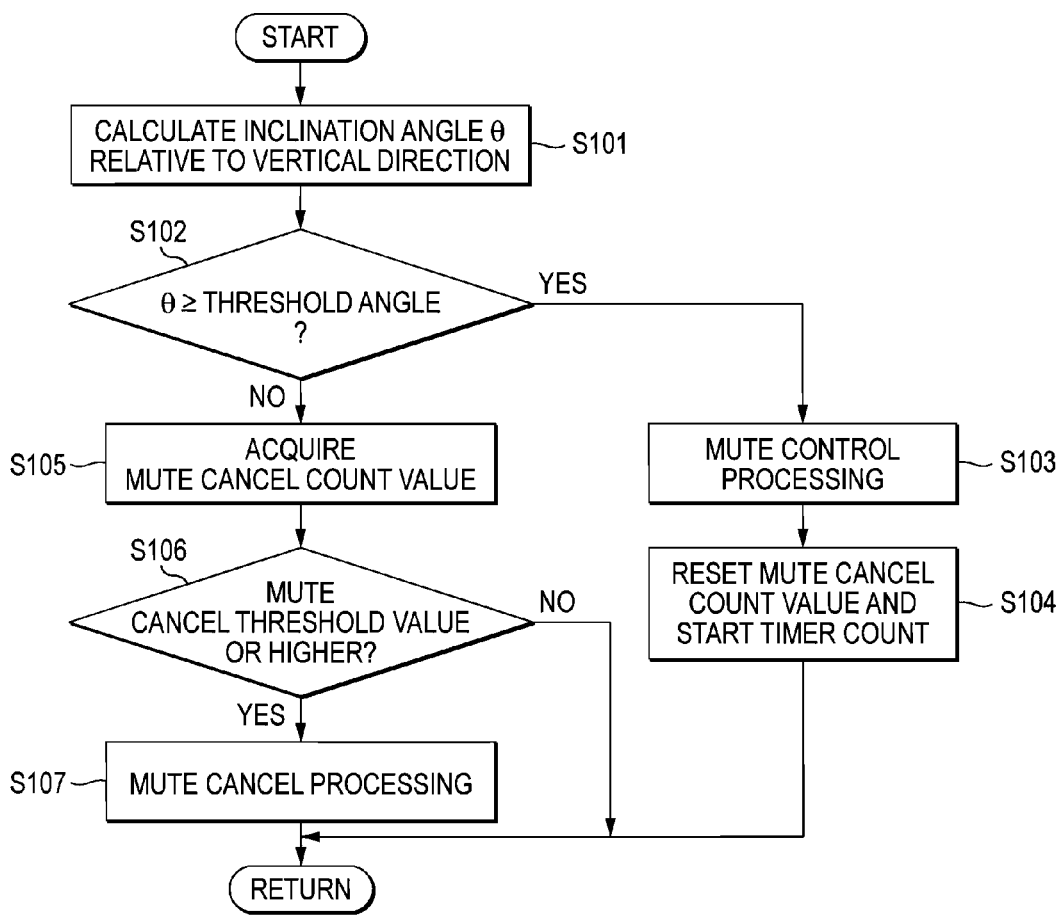
FIG. 5 is a flowchart of mute processing in the sound emission and collection device according to the embodiment of the present invention.
Figure 6:
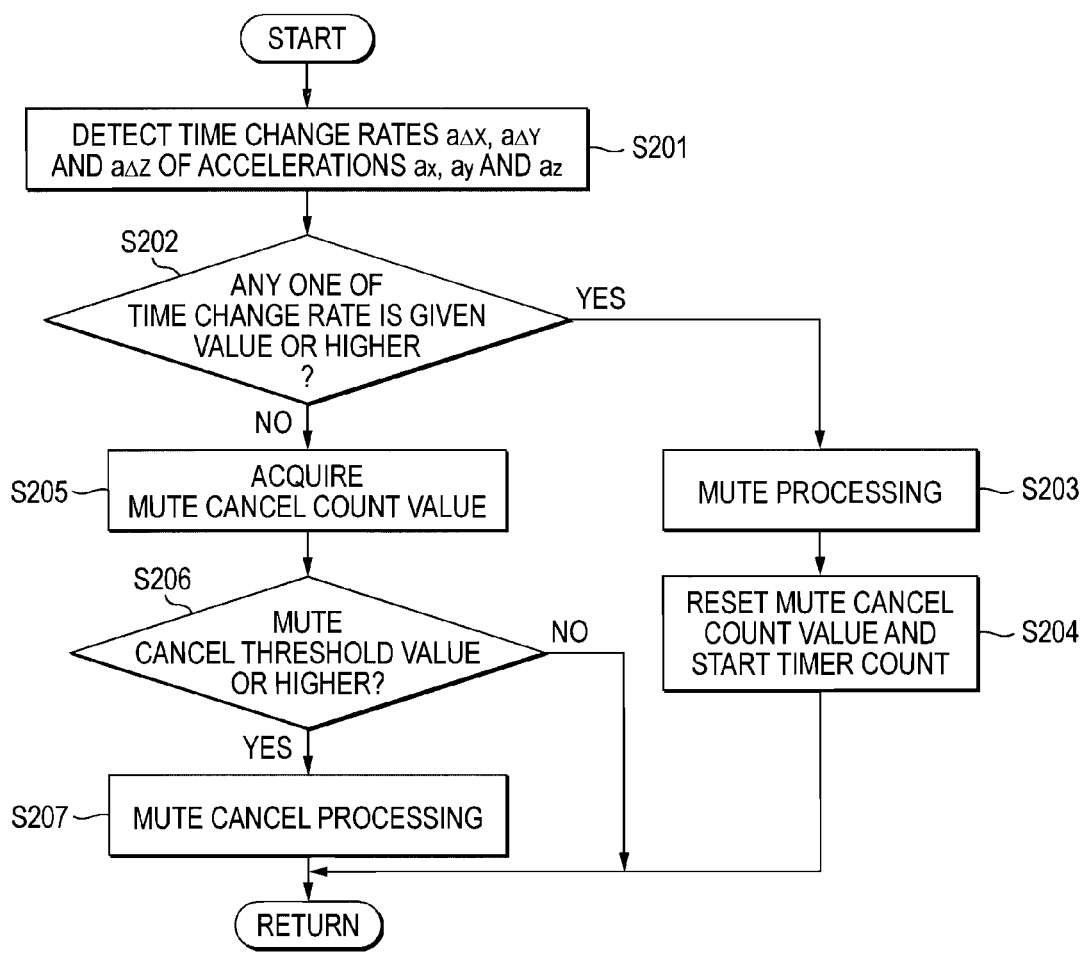
FIG. 6 is a flowchart of mute processing in the sound emission and collection device according to the embodiment of the present invention.

FIG. 1(A) is a perspective view illustrating an exterior of the sound emission and collection device 1 according to this embodiment, and FIG. 1(B) is a front view of the sound emission and collection device 1. FIG. 1(C) is a top view of the sound emission and collection device 1, and FIG. 1(D) is a side view of the sound emission and collection device 1 viewed from a right face 2R side thereof. FIG. 2 is a circuit block diagram illustrating the sound emission and collection device 1 according to this embodiment. FIG. 3(A) and FIG. 3(B) are diagrams illustrating a use of the sound emission and collection device 1 according to this embodiment. FIG. 3(A) is a perspective view of the exterior in a vertical posture which is a basic posture, and FIG. 3(B) is a perspective view of the exterior in a horizontal posture. FIG. 4(A), FIG. 4(B), and FIG. 4(C) are diagrams illustrating a posture detection concept of the sound emission and collection device 1 according to this embodiment. FIGS. 5 and 6 are flowcharts of mute processing in the sound emission and collection device 1 according to this embodiment.

The sound emission and collection device 1 includes a cuboidal housing 2. The housing 2 includes two speakers SP1 and SP2, and three microphones MIC1, MIC2, and MIC3 as illustrated in FIG. 1(A) to FIG. 1(D). Also, the housing 2 internally includes an acceleration sensor 11 for detecting accelerations $a_x$, $a_y$, and $a_z$ in three orthogonal axial (Sx, Sy, Sz) directions. Further, the housing 2 internally includes a circuit module for realizing a circuit illustrated in FIG. 2 although not illustrated in FIG. 1(A) to FIG. 1(D).

The two speakers SP1 and SP2 are arranged in a front face 2F of the housing 2 along a longitudinal direction. In this situation, the speakers SP1 and SP2 are installed so that a direction orthogonal to the front face 2F of the housing 2 matches a center direction of sound emission.

A plurality of the microphones MIC1, MIC2, and MIC3 each having a unidirectionality is disposed on a top face 2U of the housing 2. The microphones MIC1, MIC2, and MIC3 are arranged so that vibrating surfaces (sound receiving surfaces) thereof are orthogonal to the top face 2U. The microphones MIC1, MIC2, and MIC3 are arranged so that the respective vibrating surfaces face an inside area surrounded by the microphones MIC1, MIC2, and MIC3.

The mutual relative positions of those microphones MIC1, MIC2, and MIC3 are fixed by respective microphone support frames 3 each formed of a rigid body made of resin or the like. Then, the microphone support frames 3 are fixed to the top face 2U of the housing 2 by respective microphone frame support members 4.

Further, the microphones MIC1, MIC2, and MIC3 are arranged so that each of angles formed by the mutual vibrating surfaces becomes 120°, and arranged so that the vibrating surfaces are as close as possible to each other. As a result, a direction (maximum sound collection sensitivity direction) Dm1 in which a sound collection sensitivity of the microphone MIC1 becomes maximum, a maximum sound collection sensitivity direction Dm2 in which a sound collection sensitivity of the microphone MIC2 becomes maximum, and a maximum sound collection sensitivity direction Dm3 in which a sound collection sensitivity of the microphone MIC3 becomes maximum are set to intersect with each other in the center of the inside area surrounded by the microphones. In this situation, the microphones MIC1, MIC2, and MIC3 are installed so that the maximum sound collection sensitivity direction Dm3 of the microphone MIC3 matches sound emission center directions Dh1 and Dh2 of the speakers SP1 and SP2, that is, a direction orthogonal to the front face 2F of the housing 2.

With the above configuration, the microphone MIC3 collects sound with a unidirectionality in which the direction of the front face 2F of the housing 2 matches the maximum sound collection sensitivity direction Dm3. The microphone MIC1 collects the sound with a unidirectionality in which a direction forming 120° relative to the maximum sound collection sensitivity direction Dm3 counterclockwise when viewed from the top face 2U matches the maximum sound collection sensitivity direction Dm1. That is, the microphone MIC1 collects the sound with a left rear direction of the housing 2 which is a back face 2B side on a left face 2L side of the housing 2 as the maximum sensitivity. Further, the microphone MIC2 collects the sound with a unidirectionality in which a direction forming 120° relative to the maximum sound collection sensitivity direction Dm3 clockwise when viewed from the top face 2U matches the maximum sound collection sensitivity direction Dm2. That is, the microphone MIC2 collects the sound with a right rear direction of the housing 2 which is the back face 2B side on a right face 2R side of the housing 2 as the maximum sensitivity. With the use of the microphones MIC1, MIC2, and MIC3 having the unidirectionality in which the positional relationships of the maximum sound collection sensitivity directions Dm1, Dm2, and Dm3 are thus set, the sound can be collected from all directions of the sound emission and collection device 1.

The sound emission and collection device 1 is located, for example, on a desk, with a state in which the housing 2 thus equipped with the speakers SP1 and SP2 and the microphones MIC1, MIC2, and MIC3 are installed so that the top face 2U faces an upper vertical direction and a bottom face 2D faces a lower vertical direction as a basic posture, as illustrated in FIG. 1(A) to FIG. 1(D).

The acceleration sensor 11 is a sensor element that can detect the accelerations $a_x$ in the Sx direction, the accelerations $a_y$ in the Sy direction, and the accelerations $a_z$ in the Sz direction, which are orthogonal to each other, as illustrated in FIG. 4(A) to FIG. 4(C). The acceleration sensor 11 is fixed to the housing 2 in such a manner that the Sy direction is parallel to a vertical direction (longitudinal direction in a front view) in the basic posture, the Sx direction is parallel to a width direction (lateral direction in a front view) in the basic posture, and the Sz direction is parallel to a depth direction in the basic posture. In this situation, the acceleration sensor 11 is located at a given position close to the top face 2U side within the housing 2. An installation position of the acceleration sensor 11 is not limited to the position illustrated in FIG. 1(A) to FIG. 1(D).

Subsequently, a circuit configuration of the sound emission and collection device 1 according to this embodiment will be described with reference to the drawings.

The housing 2 of the sound emission and collection device 1 is internally equipped with a circuit module. The circuit module is formed with a controller 10, a memory 12, a sound collection controller 13, a mute controller 14, a sound emission controller 15, an I/F (interface unit) 16, and a circuit connecting those functional units, except the microphones MIC1, MIC2, and MIC3 and the speakers SP1 and SP2 illustrated in FIG. 2. Those circuits are totally controlled by the controller 10.

The acceleration sensor 11, as described above, detects three accelerations $a_x$, $a_y$, and $a_z$ according to the posture of the housing 2 at given time intervals and sequentially outputs the accelerations $a_x$, $a_y$, and $a_z$ to the controller 10.

The controller 10 detects the posture or a travel state of the housing 2 from the accelerations $a_x$, $a_y$, and a input from the acceleration sensor 11, and conducts the mute control for the mute controller 14.

The controller 10 detects an inclination angle $\theta$ with respect to the vertical direction from the accelerations $a_x$, $a_y$, and $a_z$ with reference to the vertical posture of the housing 2 which is the basic posture. The detection of the inclination angle $\theta$ is executed as follows.

As illustrated in FIG. 4(A), in the case of the basic posture, in the acceleration sensor 11, only the accelerations $a_y$ is a given value which is not substantially "0", and the accelerations $a_x$ and $a_z$ are substantially "0". On the other hand, as illustrated in FIG. 4(B), when the housing 2 is inclined at the given angle $\theta$ from the vertical direction with respect to the basic posture, the acceleration $a_z$ remains substantially "0", but the acceleration $a_x$ increases to a given level which is not substantially "0" according to the inclination angle $\theta$, and the acceleration $a_y$ decreases according to the inclination angle $\theta$ although being not substantially "0".

The controller 10 compiles a database of a relationship between those accelerations $a_x$, $a_y$, $a_z$, and the inclination angle $\theta$ (for example, a relationship between the acceleration $a_y$ in the vertical direction in the basic posture and the inclination angle), and stores the database in the memory 12 in advance. Then, the controller 10 calculates the inclination angle $\theta$ with reference to the database stored in the memory 12 on the basis of the acquired accelerations $a_x$, $a_y$, and $a_z$. The controller 10 conducts the mute control for the mute controller 14 if the inclination angle $\theta$ is a given value or higher.

Together with the mute control caused by the inclination angle $\theta$, the controller 10 detects a rapid travel of the housing 2. The detection of the rapid travel is executed as follows.

As illustrated in FIG. 4(A), when the housing 2 does not travel in the basic posture, in the acceleration sensor 11, only the acceleration $a_y$ becomes the given value which is not substantially "0", and the accelerations $a_x$ and $a_z$ become substantially "0". On the other hand, as illustrated in FIG. 4(C), when the housing 2 rapidly travels in an + direction of the Sx coordinates and in an + direction of the Sz coordinates while maintaining the basic posture, and in a broad sense, while the inclination angle $\theta$ is lower than a given angle for mute control, the acceleration $a_y$ hardly changes, and the accelerations $a_x$ and $a_z$ rapidly change to values which are not substantially "0" according to the travel speed.

The controller 10 stores the accelerations $a_x$, $a_y$, and $a_z$ which are sequentially input in the memory 12 for a given period, and also stores threshold values of time change rates of the accelerations $a_x$, $a_y$, and $a_z$ in the memory 12. Then, the controller 10 reads the past accelerations $a_x$, $a_y$, and $a_z$ every time the controller 10 acquires the accelerations $a_x$, $a_y$, and $a_z$, calculates time change rates $a_{Ax}$, $a_{Ay}$, and $a_{Az}$ of the accelerations, and determines whether the time change rates are the respective threshold values, or higher, or not.

The controller 10 conducts the mute control for the mute controller 14 if the time change rates $a_{Ax}$, $a_{Ay}$, and $a_{Az}$, of the accelerations $a_x$, $a_y$, and $a_z$ are the threshold values or higher.

The controller 10 continuously conducts the mute control at given time intervals, and cancels the mute control unless a condition for conducting the mute control continues for a given time length after the mute control has been conducted once.

Also, when the controller 10 detects that the accelerations $a_x$, $a_y$, and $a_z$ that have been input from the acceleration sensor 11 do not dynamically change for a relative long specific time or longer, the controller 10 determines whether the housing is the basic posture or the horizontal posture on the basis of a level relationship of those static accelerations $a_x$, $a_y$, and $a_z$. For example, in the case of the vertical posture which is the basic posture as illustrated in FIG. 1(A) to FIG. 1(D) and FIG. 3(A), the accelerations $a_y$ is a given value which is not substantially "0", but the accelerations $a_x$ and $a_z$ are substantially "0". Accordingly, if the controller 10 detects that the relationship of those accelerations continues for the given time, the controller 10 determines that the housing 2 is in the vertical posture which is the basic posture. On the other hand, in the case of the horizontal posture as illustrated in FIG. 3(B), the accelerations $a_x$ is a given value which is not substantially "0", but the accelerations $a_y$ and $a_z$ are substantially "0". Accordingly, if the controller 10 detects that the relationship of those accelerations continues for the given time, the controller 10 determines that the housing 2 is in the horizontal posture. Then, the controller 10 instructs the sound emission controller 15 to conduct the sound emission control according to the posture thus detected.

The microphone MIC1 generates a sound collection signal Sc1 compliant with its own directionality, and outputs the signal to the sound collection controller 13. The microphone MIC2 generates a sound collection signal Sc2 compliant with its own directionality, and outputs the signal to the sound collection controller 13. The microphone MIC3 generates a sound collection signal Sc3 compliant with its own directionality, and outputs the signal to the sound collection controller 13.

The sound collection controller 13 combines the sound collection signals input from the respective microphones MIC1, MIC2, and MIC3 on the basis of a sound collection directionality control parameter to generate a directionality control sound collection signal Ss. With this processing, for example, in the case of the vertical posture that is the basic posture as illustrated in FIG. 3(A), the sound collection controller 13 generates the directionality control sound collection signal Ss having an intense sensitivity in the front face direction of the housing 2, or generates the directionality control sound collection signal Ss having a uniform sensitivity over an entire circumference of the housing 2. The directionality of the directionality control sound collection signal Ss may be appropriately set according to a required sound collection specification. The directionality control sound collection signal Ss thus generated is output to the mute controller 14.

The mute controller 14 outputs the input directionality control sound collection signal Ss to the I/F 16 as it is if the mute control is not conducted by the controller 10. On the other hand, the mute controller 14 does not output the input directionality control sound collection signal Ss if the mute control is conducted by the controller 10. That is, the mute controller 14 functions to output a virtual soundless signal Sm to the I/F 16 if the mute control is conducted.

The sound emission controller 15 generates speaker sound signals Sh1 and Sh2 from sound emission signals Shu1 and Shu2 input through the I/F 16 on the basis of an instruction of the sound emission control from the controller 10. The sound emission controller 15 supplies the speaker sound signal Sh1 to the speaker SP1, and supplies the speaker sound signal Sh2 to the speaker SP2. For example, if the sound emission controller 15 receives an instruction for sound emission control in the basic posture from the controller 10, the sound emission controller 15 supplies the speaker sound signals Sh1 and Sh2 to the speakers SP1 and SP2 so that the same sound is emitted from the speakers SP1 and SP2 in phase as illustrated in FIG. 3(A). On the other hand, if the sound emission controller 15 receives an instruction for sound emission control in the horizontal posture from the controller 10, the sound emission controller 15 supplies the speaker sound signals Sh1 and Sh2 to the speakers SP1 and SP2 so that different sounds (for example, an L signal and a R signal of stereo) are emitted from the speakers SP1 and SP2 as illustrated in FIG. 3(B).

The speaker SP1 is driven in response to the speaker sound signal Sh1, and emits the sound, and the speaker SP2 is driven in response to the speaker sound signal Sh2, and emits the sound.

With the above configuration, the sound emission and collection device 1 outputs the sound collection signals collected by the microphones MIC1, MIC2, and MIC3 and the directionality control sound collection signal Ss based on the basic posture if the housing 2 does not rapidly travel in substantially the basic posture, and can output a mute signal (soundless signal) when the housing 2 is inclined or rapidly travels. As a result, an impact sound occurring when the housing 2 is inclined and overturns, a frictional sound occurring due to a friction between the bottom face 2D and an installation surface 100 when the housing 2 travels, and an impact sound occurring when the housing collides with an object or a human can be prevented from being output.

Also, unless the condition for conducting the mute control continues for a given time length after the mute control has been conducted once, the mute control is canceled. As a result, the housing 2 inclined at the inclination angle θ or higher can be returned to the basic posture, or the directionality control sound collection signal Ss can be automatically again output after the travel of the housing has been finished.

Subsequently, a description will be given of a flow of the above-mentioned mute control with reference to flowcharts of FIGS. 5 and 6. FIG. 5 illustrates a flow of the mute control for the inclination, and FIG. 6 illustrates a flow of the mute control for the travel. For simplification of description, mute control processing for the inclination and mute control processing for an acceleration change will be described below, individually. However, those mute conditions are processed by logical addition. That is, the soundless signal Sm continues to be output from the mute controller 14 while the mute control is being conducted under any one of those conditions, and if mute cancel conditions are satisfied by both of those conditions, the mute cancel processing is conducted to output the directionality control sound collection signal Ss.

(Mute Control Processing Based on Inclination Angle θ With Respect to Vertical Direction)

The controller 10 acquires the accelerations $a_x$, $a_y$, and $a_z$ from the acceleration sensor 11 every given time interval, for example, every 20 msec, and calculates the inclination angle θ with respect to the vertical direction (S101). In this situation, the controller 10 calculates the inclination angle θ, and counts up a mute cancel count value. The controller 10 sets a value of a threshold value or higher determined in S106 as an initial value of a mute cancel count value.

The controller 10 executes the mute control processing (S103) if the controller 10 determines that the inclination angle θ with respect to the vertical direction is an angle of an inclination threshold value, for example, 45° or higher (yes in S102). At the same time, the controller 10 resets the mute cancel count value, and starts timer count (S104). That is, unless the mute control is conducted at that time, the controller 10 conducts the mute control processing, and if the mute control is conducted at that time, the controller 10 continues a mute control processing state as it is.

On the other hand, if the controller 10 determines that the inclination angle θ with respect to the vertical direction is lower than the angle of the threshold value (no in S102), the controller 10 acquires the mute cancel count value (S105). The controller 10 controls the mute processing to be not conducted if the mute cancel count value reaches the threshold value (yes in S106). That is, the controller 10 cancels the mute control processing if the mute control processing is conducted at that time, and continues the cancel state of the mute control processing unless the mute control processing is conducted at that time (S107).

On the other hand, the controller 10 continues the mute control processing as it is unless the mute cancel count value reaches the threshold value, that is, unless a given time (for example 500 msec.) is elapsed from a last mute (no in S106).

(Mute Control Processing for Rapid Travel or Overturn)

The controller 10 sequentially acquires the accelerations $a_x$, $a_y$, and $a_z$ from the acceleration sensor 11 every given time interval, for example, every 20 msec, and calculates the time change rates $a_{Ax}$, $a_{Ay}$, and $a_{Az}$ of the accelerations ax, ay, and az (S201). In this situation, the controller 10 calculates the time change rates $a_{Ax}$, $a_{Ay}$, and $a_{Az}$ of the accelerations ax, ay, and az, and counts up the mute cancel count value. The controller 10 sets a value of a threshold value or higher determined in S206 as an initial value of a mute cancel count value.

The controller 10 executes the mute control processing (S203) if the controller 10 determines that any one of the time change rates $a_{Ax}$, $a_{Ay}$, and $a_{Az}$ of the accelerations ax, ay, and az is the given threshold value or higher (yes in S202). At the same time, the controller 10 resets the mute cancel count value, and starts the timer count (S204). That is, unless the mute control is conducted at that time, the controller 10 conducts the mute control processing, and if the mute control is conducted at that time, the controller 10 continues the mute control processing state as it is.

On the other hand, if the controller 10 determines that all of the time change rates $a_{Ax}$, $a_{Ay}$, and $a_{Az}$ of the accelerations $a_x$, $a_y$, and $a_z$ are lower than the given threshold value (no in S202), the controller 10 acquires the mute cancel count value (S205). The controller 10 controls the mute processing not to be conducted if the mute cancel count value reaches the threshold value (yes in S206). That is, the controller 10 cancels the mute control processing if the mute control processing is conducted at that time, and continues the cancel state of the mute control processing unless the mute control processing is conducted at that time (S207).

On the other hand, the controller 10 continues the mute control processing as it is unless the mute cancel count value reaches the threshold value, that is, unless a given time (for example 500 msec.) is elapsed from a last mute (no in S206).

With the above processing, the sound emission and collection device 1 according to this embodiment can output only the sound collection signal collecting only a target sound collected from the circumference of the subject device in the basic posture without outputting noise occurring when the housing is inclined, rapidly travels, or overturns.

In more detail, with the use of the configuration of the sound emission and collection device according to the above-mentioned embodiment, since the mute control processing is conducted at the time of detecting the rapid travel or the overturn, an initial sound of the rapid travel or overturn cannot be muted, but the impact sound occurring when the overturned housing collides with a face of a desk on which the housing is located can be muted. Under the circumstances, if a memory that buffers the sound collection signal (directionality control sound collection signal) is provided in the mute controller 14, and a process of delaying the sound collection signal by a detection time and outputting the sound collection signal is always conducted, a sound that initially occurs can be also muted.

In the above-mentioned description, the sound emission and collection device is exemplified. Also, the above-mentioned configuration can be applied to a sound collection device having only a sound collection function.

Also, in the above-mentioned description, an example in which no sound is collected, that is, the soundless signal is output in the case of the horizontal posture is illustrated. However, the sound can be collected even in the horizontal posture. In this case, the controller 10 may instruct the sound collection controller 13 to conduct a given sound collection control together with the above-mentioned sound emission control in the horizontal posture.

Also, in the above-mentioned description, a case in which the housing is inclined toward the side face direction is exemplified. Similarly, the mute control processing can be applied to a case in which the housing is inclined toward the front face direction or the back face direction using the accelerations $a_x$, $a_y$, and $a_z$.

Also, in the above-mentioned description, a case of the horizontal travel in the basic posture is exemplified. Similarly, the mute control processing can be applied to a case including the vertical travel.

Also, in the above-mentioned description, a case in which the housing is cuboidal is exemplified. However, the housing may be formed into other configurations. Further, a case in which the acceleration direction matches the direction orthogonal to the housing is illustrated. However, the present invention is not particularly limited to this configuration, and can be designed to detect the accelerations in the three axial directions which are not parallel where vectors that are spatially independent from each other can be formed.

Also, in the above-mentioned description, an example in which the inclination of the housing is determined according to the relationship between the acceleration $a_y$ in the vertical direction in the basic posture and the inclination angle θ is exemplified. However, other accelerations, for example, the accelerations $a_x$ and $a_y$ may be obtained if the inclination angle θ is provided, and the inclination of the housing may be determined according to the relationship between the accelerations $a_x$ and $a_y$, and the inclination angle θ.

Also, in the above-mentioned description, an example in which the acceleration sensor is used for detecting the motion, the posture, or the travel state of the housing is illustrated. However, the present invention is not limited to the acceleration sensor, but another detection device that can detect the motion of the housing, a change in the posture, and the travel state may be used. For example, a mechanical switch is conceivable, which is disposed outside the side face of the housing so as to output an on-signal when the housing is in the Vertical posture (for example, FIG. 3(A)), and an off-signal when the housing is in the horizontal posture (for example, FIG. 3(B)). This switch may be disposed inside the housing without being limited to the outside of the side face.

According to an aspect of the invention, the sound signal processing apparatus includes a sound collector, a sound collection signal controller, a posture detector, and a sound signal selector. The sound collector collects the sound from the circumference of the subject apparatus, and generates a sound collection signal. The sound collection signal controller generates an intended sound signal on the basis of the sound collection signal of the sound collector. The posture detector is fixed to the housing of the subject apparatus, and detects a posture of the housing. The sound signal selector selectively outputs the sound signal or the soundless signal on the basis of the detected posture.

When the housing is inclined from the basic posture or travels, it is selected whether the sound signal based on the sound collection signal is output on the basis of a change in the output value, or the soundless signal is output instead of the sound signal, by using a fact that an output value from the posture detector is changed. That is, if there is a possibility that the housing collides with something (installation surface or other installations) due to overturn or travel caused by the inclination of the housing to generate an impact sound, and the impact sound is included in the sound collection signal, the sound signal based on the sound collection signal is not output, and the soundless signal is output. As a result, for example, no sound signal including the impact sound is transmitted to another apparatus that communicates with the subject apparatus.

Also, the posture detector may be configured by an acceleration sensor that measures accelerations in three directions orthogonal to each other.

With the use of the acceleration sensor that obtains orthogonal three-dimensional detection data as the posture detector, even if the housing (apparatus) take any action, the action can be detected.

Also, the sound signal selector may output the sound signal if a relative level difference between an output level of the acceleration sensor in the vertical direction when the housing is in the basic posture, and an output level of the acceleration sensor in a direction corresponding to the vertical direction in the basic posture when the housing is not in the basic posture is lower than a given level, and output the soundless signal if the difference is the given level or higher.

This specifically shows processing when the housing is inclined from the basic posture, and the output level of the acceleration sensor in the direction corresponding to the vertical direction when the housing is in the basic posture at each time is observed, thereby enabling the inclination angle of the housing with respect to the vertical direction when the housing is in the basic posture to be detected. For example, the vertical direction in the basic posture is inclined by 45° with respect to the vertical direction at that time if the housing is inclined by 45°. Accordingly, the output level of the acceleration sensor in the vertical direction in the basic posture in a state where the housing is inclined by 45° becomes an output level obtained by multiplying the output level of the acceleration sensor in the vertical direction in a state where the housing is in the basic posture by cos 45°. The inclination angle of the housing can be detected on the basis of a change in the output level. Then, when it is detected that the housing is inclined by a given angle or larger, that is, when an angle of overturn from the basic posture becomes the given angle or larger, the output is switched to the soundless signal. As a result, for example, in the case where after the housing is lifted up from the basic posture and then laid horizontally, the housing is placed on the desk, even if the impact sound occurs when the housing is placed thereon, the sound signal including the impact sound is not output.

Also, the sound signal selector may output the sound signal if the time change rate of the output level detected by the acceleration sensor is lower than the given level, and output the soundless signal if the time change rate is the given level or higher.

This specifically shows processing when the housing rapidly moves, and the time change rate of the output level of the acceleration sensor in each direction is observed, thereby enabling the rapid travel of the housing to be detected. For example, the output level of the acceleration sensor in the horizontal direction is substantially "0" in a rest state, but if the housing rapidly travels by allowing an obstacle to collide with the housing, the output level of the acceleration sensor in the horizontal direction rapidly changes from substantially "0". That is, the time change rate of the output level in the horizontal direction becomes large. The collision with the obstacle or the rapid travel causes the impact sound or a sound occurring by a friction between the housing and the installation surface due to the travel. Under the circumstances, it is detected that the time change rate of the output level of the acceleration sensor in the horizontal direction is increased by the given value or higher, that is, when the housing rapidly travels, the output is switched to the soundless signal.

Also, when the housing is rapidly overturned from the basic posture, the output level of the acceleration sensor rapidly changes. Then, when it is detected that the time change rate of the output level of the acceleration sensor is increased by the given value or higher due to the overturn, the output is switched to the soundless signal.

In this way, the sound collection signal including various sounds occurring when the housing rapidly travels or overturns is not output. More strictly speaking, because the output is switched to the soundless signal after the rapid motion has been detected, the output of the sound signal including the sound occurring in an initial stage of the rapid motion cannot be prevented. However, the output of the sound signal including a sound occurring in a last stage of the rapid motion such as an impact sound occurring when the overturned housing collides with an external object can be prevented. Further, if the sound signal selector is equipped with the buffer memory, and a unit that outputs the sound signal with a delay, the output of the sound signal including the initial sound caused by the rapid motion can be also prevented.

Also, the sound signal selector may execute determination of the output selection of the sound signal at given timing intervals. The sound signal selector may again output the sound signal if the determination for selecting that the soundless signal is not output is continued for a given period after the output of the soundless signal has been selected.

This shows determination processing for re-switching the output to the sound signal after the output has been switched to the soundless signal. With the use of this determination processing, when it comes to a state in which the overturn or travel is stopped to enable an output of the sound signal after the output is switched to the soundless signal, the output can be automatically switched to the sound signal.

According to an aspect of the invention, after the change in the posture and the travel is detected by itself, the mute processing on the sound collection signal can be executed as the occasion demands. As a result, the noise caused by the change in the posture or the travel of the apparatus can be prevented from being transmitted to a partner apparatus or emitted.

The present invention is based on Japanese Patent Application No. 2009-196751 filed on Aug. 27, 2009, and content thereof is incorporated herein by reference.

The invention claimed is:

1. A sound signal processing apparatus comprising:
a housing configured to rest on an installation surface in a first posture;
a sound collector disposed on the housing and configured to collect a sound from an environment and generate a sound collection signal;
a signal controller configured to generate a sound signal based on the sound collection signal;
a detector disposed in or on the housing;
a controller configured to detect a posture of the housing based on a signal output from the detector; and
a selector configured to output one of the sound signal or a soundless signal that mutes noise based on the detected posture of the housing, the selector outputting the soundless signal when the housing moves from the first posture toward a second posture at which the housing contacts the installation surface to create a noise, the second posture being different from the first posture and the soundless signal being output before the housing contacts the installation surface to create the noise.

2. The sound signal processing apparatus according to claim 1, wherein: the selector selects the output of the sound signal or the soundless signal at a given timing interval, and the selector outputs the sound signal after the soundless signal has not been output for a given period after selecting the output of the soundless signal.

3. The sound signal processing apparatus according to claim 1, wherein the detector detects a motion of the housing.

4. The sound signal processing apparatus according to claim 3, wherein selector also outputs the soundless signal when the housing in the first posture is moved across the installation surface.

5. The sound signal processing apparatus according to claim 1, wherein the selector outputs the sound signal when a time change rate of an output level of the detector is lower than a given level, and the selector outputs the soundless signal when the time change rate is the given level or higher.

6. The sound signal processing apparatus according to claim 1, wherein:
the detector comprises an acceleration sensor configured to measure accelerations in three directions orthogonal to each other.

7. The sound signal processing apparatus according to claim 6, wherein the selector outputs:
the sound signal when a time change rate of an output level of the acceleration sensor is lower than a given level, and
the soundless signal when the time change rate is the given level or higher.

8. The sound signal processing apparatus according to claim 6, wherein:
when the housing is in the first posture, the acceleration sensor outputs a first output level in a first direction, among the three directions,
when the housing is in the second posture, the acceleration sensor outputs a second output level in a second direction, among the three directions, the second direction corresponding to the first direction in relation to the housing in the first posture, and
the selector outputs the sound signal when a difference between the first output level and the second output level is lower than a given level, and the selector outputs the soundless signal when the difference is the given level or higher.

9. The sound signal processing apparatus according to claim 6, wherein the selector outputs the sound signal when a difference, between an output level of the acceleration sensor in a vertical direction when the housing is in the first posture and an output level of the acceleration sensor in a direction corresponding to the vertical direction in the first posture when the housing is not in the first posture, is lower than a given level, and the selector outputs the soundless signal when the difference is at the given level or higher.

10. The sound signal processing apparatus according to claim 6, wherein selector also outputs the soundless signal when the housing collides with an object.

11. The sound signal processing apparatus according to claim 1, wherein the sound collector comprises a plurality of microphones.

* * * * *